(12) United States Patent
Kononchuk et al.

(10) Patent No.: US 6,286,685 B1
(45) Date of Patent: Sep. 11, 2001

(54) SYSTEM AND METHOD FOR WAFER THICKNESS SORTING (75) Inventors: Oleg V. Kononchuk, Brush Prairie; Stephen L. Martin, Vancouver, both of WA (US)

(73) Assignee: SEH America, Inc., Vancouver, WA (US)

(*) Notice: Subject to any disclaimer, the term of this patent is extended or adjusted under 35 U.S.C. 154(b) by 0 days.

(21) Appl. No.: 09/457,903

(22) Filed: Dec. 8, 1999

Related U.S. Application Data (63) Continuation-in-part of application No. 09/270,234, filed on Mar. 15, 1999.

(51) Int. Cl.[7] .................................................... B07B 15/00
(52) U.S. Cl. ................................................ 209/2; 700/219
(58) Field of Search .............................. 438/14, 7; 209/2, 209/1; 700/213, 219

(56) References Cited

U.S. PATENT DOCUMENTS

| | | |
|---|---|---|
| 3,971,683 | * 7/1976 | Briska et al. . |
| 4,203,799 | 5/1980 | Sugawara et al. . |
| 4,555,767 | 11/1985 | Case et al. . |
| 4,636,642 | * 1/1987 | Simons et al. . |
| 4,860,229 | 8/1989 | Abbe et al. . |
| 5,099,122 | 3/1992 | Miki . |
| 5,313,044 | 5/1994 | Massoud et al. . |
| 5,321,634 | * 6/1994 | Obata et al. . |
| 5,371,596 | 12/1994 | Hattori et al. . |
| 5,386,119 | 1/1995 | Ledger . |
| 5,420,803 | 5/1995 | Judell . |
| 5,492,594 | 2/1996 | Burke et al. . |
| 5,564,830 | 10/1996 | Böbel et al. . |
| 5,620,357 | 4/1997 | Misaka et al. . |
| 5,625,170 | * 4/1997 | Poris . |
| 5,665,199 | 9/1997 | Sahota et al. . |
| 5,681,448 | 10/1997 | Uchiyama et al. . |
| 5,704,985 | 1/1998 | Kordina et al. . |
| 5,723,378 | 3/1998 | Sato . |
| 5,791,969 | 8/1998 | Lund . |

FOREIGN PATENT DOCUMENTS

406216210-A * 8/1994 (JP) .

OTHER PUBLICATIONS

Author Unknown, "Silicon Wafer Manufacturing", date not established, Web page http://www.xensei.com/users/adex/prodtech/silicon_wafer.html., 2 pages.*

Author Unknown, "ADE's Product Families", date not established, Web page http://www.xensei.com/users/adex/prodtech/family.html., 3 pages.*

* cited by examiner

Primary Examiner—Charles Bowers
Assistant Examiner—Evan Pert
(74) Attorney, Agent, or Firm—Alston & Bird LLP (57) ABSTRACT

A system and method for sorting semiconductor substrates based on substrate thickness. The invention includes weighing each semiconductor substrate to be sorted, and then calculating the thickness of each substrate from its mass, area and density. The system may be configured to automatically sort the substrates according to the weight-based thickness calculations.

9 Claims, 6 Drawing Sheets

SYSTEM AND METHOD FOR WAFER THICKNESS SORTING

CROSS-REFERENCE TO RELATED APPLICATION

This application is a Continuation-In-Part of U.S. patent application Ser. No. 09/270,234 of Gerald R. Dietze and Oleg V. Kononchuk which was filed on Mar. 15, 1999, and which is herein incorporated by reference.

TECHNICAL FIELD

The present invention relates to sorting semiconductor substrates, and more particularly to sorting according to the thickness of semiconductor substrates.

BACKGROUND OF THE INVENTION

It is often necessary to measure the thickness of semiconductor substrates. For example, manufacturers of semiconductor substrates typically measure substrate thickness at various steps during the manufacturing process to ensure that the finished substrates meet industry and/or customer specifications. Similarly, the thickness of a semiconductor substrate is often measured during substrate manufacturing and subsequent integrated circuit fabrication to characterize prior processing steps that either increase or decrease the thickness of the substrate. Although there are several existing methods for measuring substrate thickness, none provide the combination of flexibility, accuracy, throughput and affordability that are demanded by the highly competitive electronics industry.

For example, one device for measuring substrate thickness is the capacitance thickness gauge. A capacitance thickness gauge typically uses a probe spaced adjacent a reference platform. When a semiconductor substrate is placed on the platform, the capacitance measured across the air gap between the substrate and probe indicates the thickness of the air gap. This thickness is subtracted from the known distance between the platform and probe to obtain the thickness of the substrate. However, the measurement of capacitance (and therefore thickness) is sensitive to the electrical properties of the substrate. Thus, to ensure accurate measurements, the capacitance thickness gauge may require frequent recalibration and/or the substrates may require additional processing to stabilize the electrical properties of the substrate. In either case, the additional time and/or expense incurred increase the costs of the manufacturing process.

Optical devices are also available for measuring substrates. However, these devices are sensitive to variations in the surface finish of substrates. As a result, the devices typically must be recalibrated repeatedly to accommodate for the varying surface finishes that occur at different points in the manufacturing process. Alternatively, multiple optical measurement devices must be provided so that a dedicated device may be calibrated for use at each measurement step in the manufacturing process.

Therefore, it would be desirable to have a system capable of quickly, accurately, and inexpensively measuring the thicknesses of semiconductor substrates regardless of the surface finish or electrical properties of the substrates.

SUMMARY OF THE INVENTION

The invention provides a system and method for characterizing and sorting semiconductor substrates based on the thickness of the substrates. The invention includes determining the mass of a semiconductor substrate by weighing the substrate, and then calculating the thickness of the substrate from its mass, area and density. Optionally, the system may be automated and configured to sort the substrates based on substrate thickness. Alternatively, the system may be used to characterize semiconductor processes used to remove material from the substrate.

DETAILED DESCRIPTION AND BEST MODE FOR CARRYING OUT THE INVENTION

Figure 1:
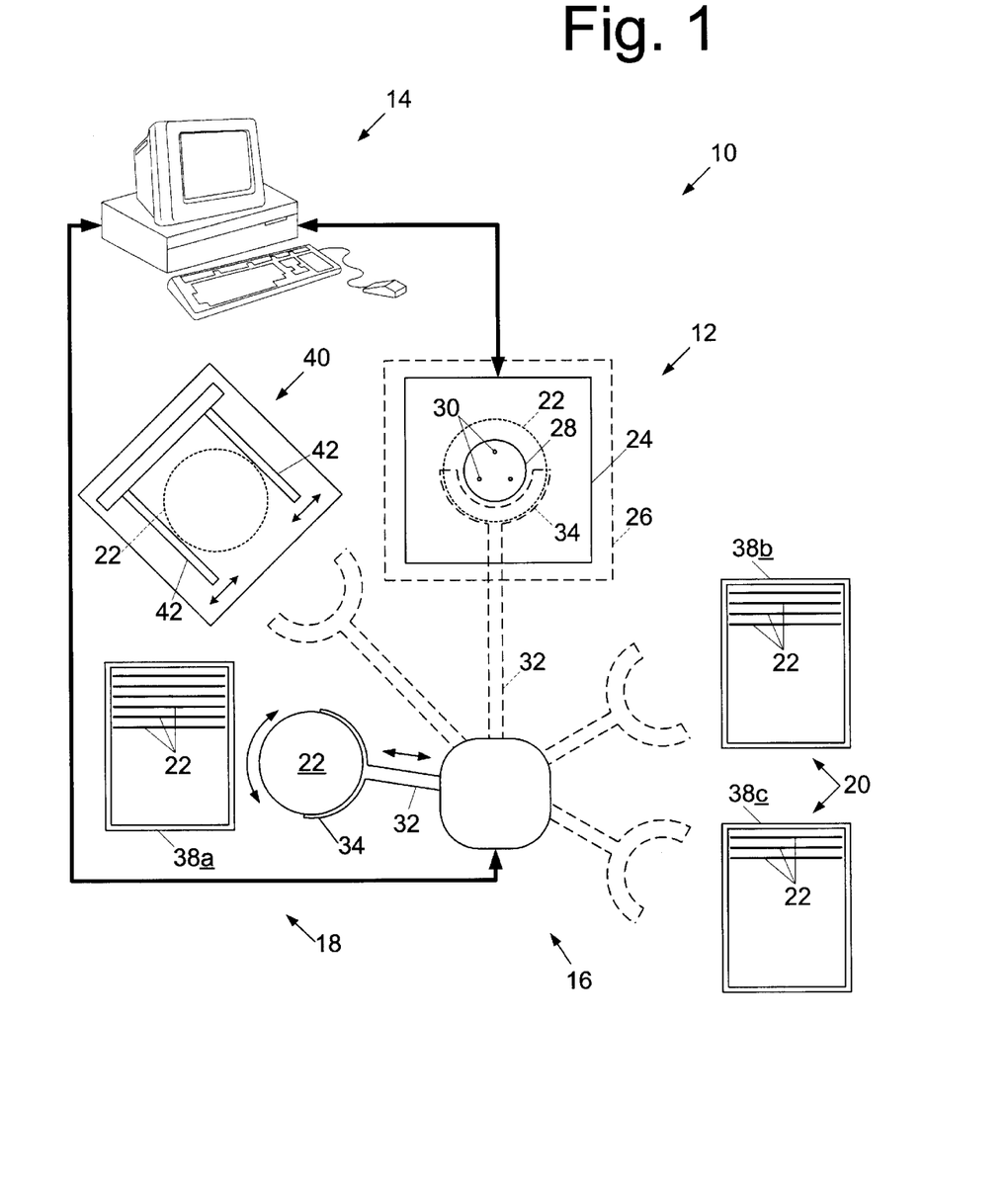
FIG. 1 is a schematic illustration of an exemplary system for sorting semiconductor substrates in accordance with the present invention.

A system configured to sort semiconductor substrates according to the present invention is indicated generally at 10, in FIG. 1. System 10 is adapted for use in a semiconductor process to characterize the thicknesses of semiconductor substrates, and to sort the substrates according to substrate thickness. In an alternative embodiment, system 10 may be used to characterize a semiconductor process for removing material from a semiconductor substrate by determining the amount of material removed by the process. As will be described in further detail below, system 10 provides accurate and repeatable measurements of substrate thickness regardless of the electrical properties or surface finishes of the substrates.

In the exemplary embodiment depicted in FIG. 1, system 10 typically includes a substrate measuring apparatus 12 operatively connected to a controller 14. Substrate measuring apparatus 12 is configured to measure the mass of a semiconductor substrate, and then communicate the measured mass to controller 14. The controller is configured to receive the measured mass of a substrate from substrate measuring apparatus 12, and then calculate the thickness of the substrate. Controller 14 is also operatively connected to a substrate transport apparatus 16, which is configured to transport semiconductor substrates from one or more substrate input locations 18 to measurement apparatus 12. Transport apparatus 16 is also configured to transport substrates from measurement apparatus 12 to one or more substrate output locations 20. In one embodiment, controller 14 operates transport apparatus 16 to transport substrates to one of plural output locations based on the calculated thickness of the substrate.

As described above, system 10 provides a cost-efficient, automated system for sorting semiconductor substrates according to substrate thickness. System 10 may easily be integrated into a semiconductor manufacturing process to measure and sort substrates without the need of human labor or intervention. It will be appreciated, however, that one or more of the functions performed by the controller and/or the transport apparatus may alternatively be performed by an operator. For example, controller 14 may be configured to output the calculated substrate thickness in human-readable form (e.g., on a video monitor), and then an operator may control the transport apparatus to transport the measured substrate to the selected output location. As a further example, substrate measuring apparatus 12 may display the measured substrate mass to an operator, who then inputs the mass into controller 14.

In FIG. 1, the semiconductor substrates are illustrated in the form of a semiconductor wafer 22. Typically, wafer 22 is a thin, circular disk of high purity semiconducting material (e.g., silicon, germanium, gallium arsenide, and etc.), having a predetermined density. The opposing planar surfaces of wafer 22 are substantially parallel, and have substantially equal diameters corresponding to industry standards. In some instances, one or more "flats" may be formed in the edges of the substrates to enable the substrates to be identified and accurately positioned during semiconductor processing steps. Thus, the area of the planar surfaces of wafers 22 may easily be determined from the predetermined diameter of the wafer minus the area removed due to any flats. Alternatively, the semiconductor substrates may have any shape as required by a particular application.

In the depicted embodiment, substrate measuring apparatus 12 includes a scale 24 at least partially enclosed within an isolation chamber 26. Scale 24 may be any suitable scale capable of measuring the mass of semiconductor substrates. It will be appreciated that the precision and accuracy of the scale will determine the precision and accuracy with which the thickness of the substrates may be measured. In one exemplary embodiment, an analytical balance having a 0.1-milligram resolution was used and found to provide excellent results, as discussed below. Such analytical balances are readily available from a variety of sources, such as Sartorius Corporation of Edgewood, N.Y.

Scale 24 includes a substrate stage 28 adapted to support a substrate during measurement. In the exemplary embodiment, stage 28 is configured to support a substrate while minimizing any contact with the substrate. Specifically, stage 28 includes three protuberances 30 arranged to support a substrate at only three points. Additionally, stage 28 is typically formed from a relatively soft material such as TEFLON or other clean room compatible polymer material to prevent scratches or other damage to the substrate. Alternative materials may also be used such as stainless steel, quartz, or etc. Stage 28 is depicted in FIG. 1 as a round platform having a diameter somewhat less than the diameter of substrate 22. However, the stage may alternatively be formed in any desired shape or configuration that is capable of supporting the substrates and compatible with the scale.

Isolation chamber 26 is typically formed from an antistatic, clean room compatible plastic or other suitable material. The plastic may be transparent to allow an operator to monitor the operation and condition of the scale. The isolation chamber functions to maximize the accuracy of scale 24 by insulating the scale from external air currents, vibrations, and etc. Optionally, scale 24 may be mounted on a vibration isolation table (not shown) to provide additional protection against vibration. Chamber 26 may include one or more access holes (not shown) to receive communication cabling between controller 14 and scale 24.

Although controller 14 is depicted as a desktop computer, those of skill in the art will appreciate that controller 14 may alternatively be a mainframe computer, a hand-held computer, a distributed computer network, or any other suitable device or apparatus for communicating with scale 24. Furthermore, while controller 14 is depicted as a separate device, it will be appreciated that some or all of the controller may be integrated into scale 24 and/or transport control apparatus 16. In any case, controller 14 typically includes a computer processor (not shown) configured to execute control software. The control software may be developed in any suitable programming language, such as VISUAL BASIC, or etc. Controller 14 also typically includes data storage and input/output means, as is well known in the art.

As mentioned above, controller 14 is operatively connected to substrate transport apparatus 16, as well as to scale 24. In the exemplary embodiment, transport apparatus 16 includes a robotic arm 32 adapted to grasp a semiconductor substrate, and to carry the substrate between selected locations. Arm 32 typically is capable of moving with multiple degrees of freedom to lift, transport, and place the substrate as instructed by the controller. One example of a suitable robotic transport apparatus is available from Cybeq Systems, of Sunnyvale, Calif. However, there are many other suitable robotic substrate transports well known to those of skill in the semiconductor manufacturing industry.

As depicted i n FIG. 1, a distal end of arm 32 is formed in the shape of a partial ring 34 with an inner diameter at least somewhat larger than the diameter of stage 28. This allows the arm to place a substrate on the stage without contacting the stage, which might cause damage to the stage and/or the scale. Ring 34 typically includes gripping means, which are well known in the industry, for grasping and lifting the substrate without damaging it. While transport apparatus 16 is described and depicted as having a single arm 32, it will be appreciated that the transport apparatus alternatively may include plural arms, each configured to perform separate or overlapping functions.

Figure 2:
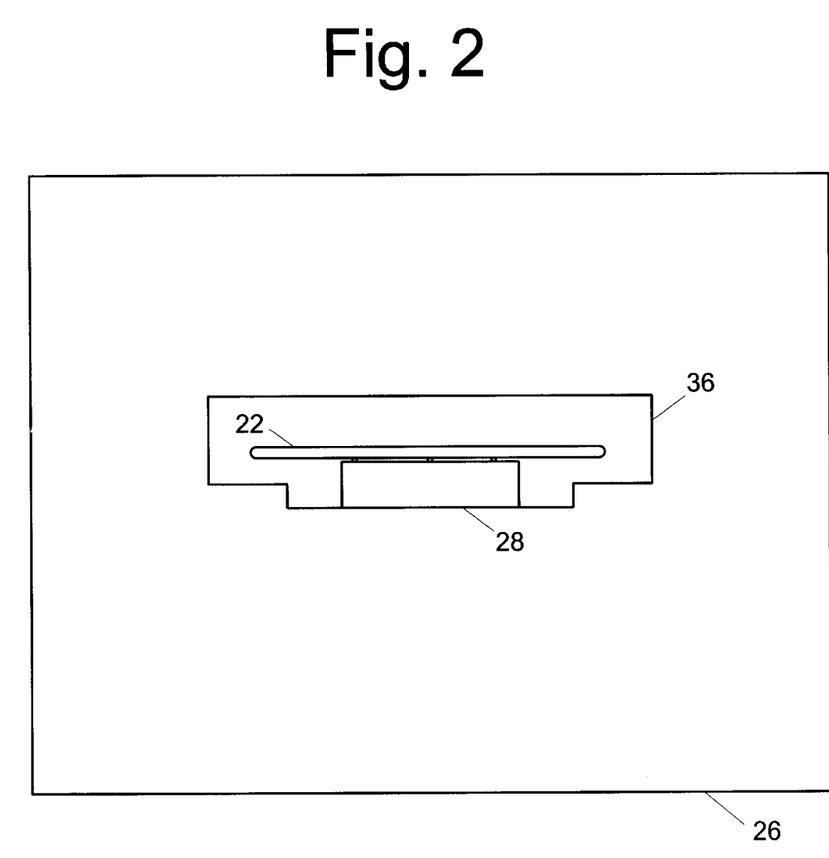
FIG. 2 is a front elevation view of the isolation chamber showing the aperture for receiving the robotic arm.

Turning attention briefly to FIG. 2, a front portion of isolation chamber 26 is shown. In the exemplary embodiment, chamber 26 includes a T-shaped aperture 36 configured to receive robotic arm 32 and substrate 22. Aperture 36 is configured to allow the robotic arm to move freely as required, without substantially degrading the environmental isolation provided by the chamber. Furthermore, the aperture enables the substrates to be loaded and unloaded from stage 28 without removing the isolation chamber. As a result, the time required to load, measure, and unload a substrate is minimized, and the throughput of the system is maximized. Alternatively, the isolation chamber may be movable to allow the robotic arm to load and unload the substrates.

Turning back to FIG. 1, substrates 22 typically are held in a substrate holding apparatus such as portable wafer cassettes 38a–c. As is well known in the industry, wafer cassettes are configured to hold a plurality of wafers maintained in generally parallel separation. Robotic arm 32 is configured to remove a wafer from a selected location in a wafer cassette, as well as to place a wafer in a selected location in the cassette. (For clarity, cassettes 38a–c are depicted in an orientation with the wafers held vertically. However, the cassettes typically will be oriented with the wafers held horizontally for ease of loading and unloading by the robotic arm.) Arm 32 is operated by controller 14 to remove wafers from cassette 38a and transport the wafer to scale 24 for weighing. The scale determines the mass of each wafer and sends the information to the controller. The controller calculates the thickness of each wafer, and then instructs the robotic arm to place the wafers in one of cassettes 38b or 38c, depending on the thicknesses. It will be appreciated that while the exemplary embodiment has been illustrated and described as having one source cassette 38a, and two destination cassettes 38b, 38c, there may be any number of source and destination cassettes as required by the semiconductor process. Furthermore, a source cassette may also serve as a destination cassette so that a substrate is placed back in the source cassette if the thickness of the substrate is within a specified range.

Although substrates 22 were described above as having substantially equal diameters, it will be appreciated that system 10 may alternatively be configured to measure the diameter of each substrate rather than assuming a standard value. Thus, in another embodiment, system 10 also includes a substrate diameter measuring device 40. Device 40 may be operatively connected to controller 14 and configured to communicate the measured diameter of a substrate to the controller. After receiving the diameter from device 40, the controller can then determine the area of the substrate by calculation. The controller can then calculate the substrate thickness based on the calculated area and measured mass of the substrate.

Substrate diameter measuring device 40 may be configured in a variety of ways. In FIG. 1, device 40 is a discrete device with a pair of caliper arms 42 operable to close on the sides of a substrate to determine its diameter. The substrate diameter measuring device designated Model No. LET-820, available from Kobe Steel is just one example of several suitable devices which may be used. Typically, device 40 is controlled by controller 14 and compatible with transport apparatus 16 so that substrates may be loaded onto device 40, measured, and then unloaded automatically.

While substrate diameter measuring device 40 is shown and described as being separate from substrate measuring apparatus 12, it will be appreciated that the functions of device 40 and apparatus 12 may alternatively be integrated into a single apparatus which measures both substrate diameter and substrate mass. It will also be appreciated that the diameter and mass of a substrate may be measured in any order or simultaneously, as desired.

Figure 3:
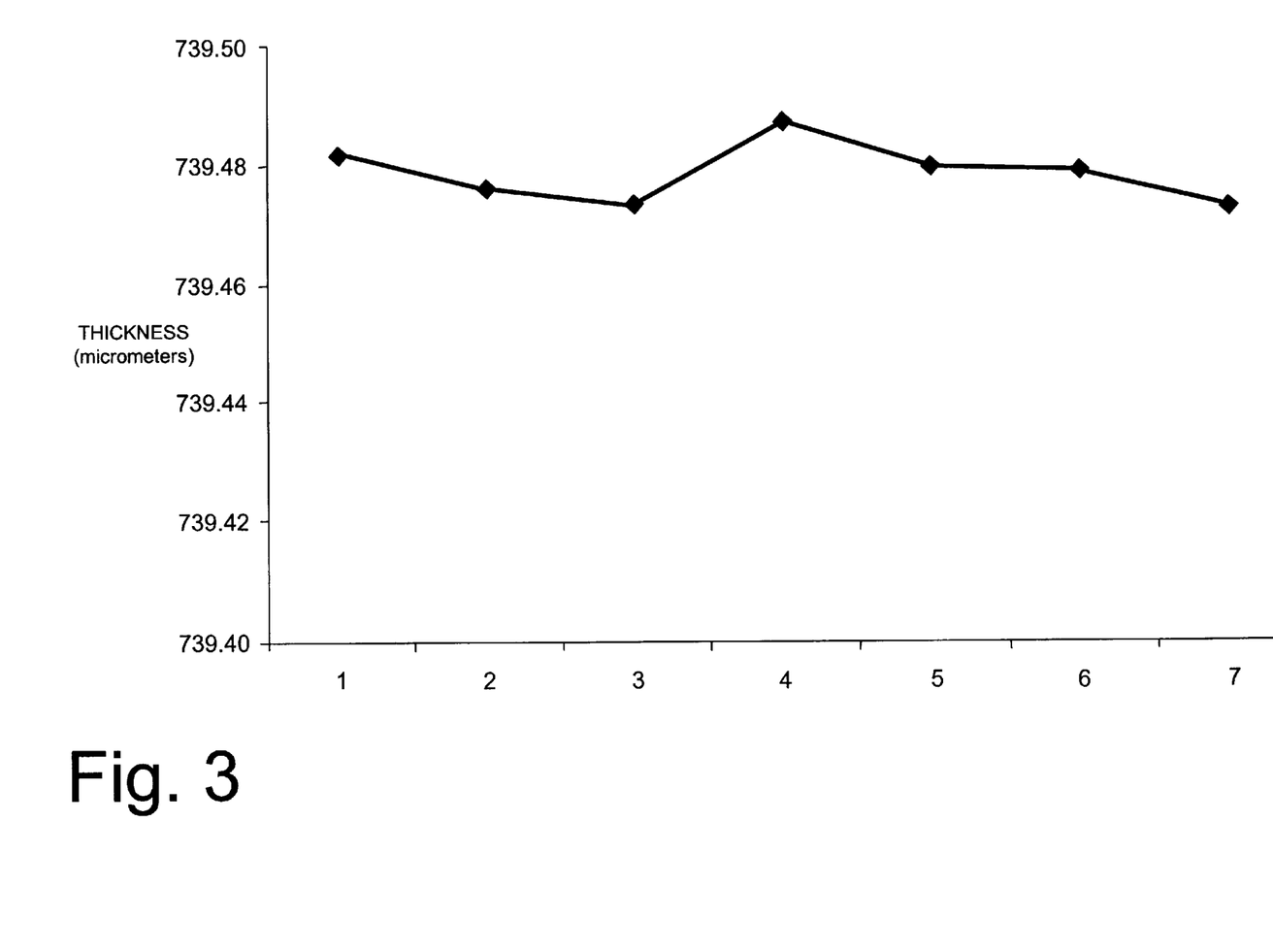
FIG. 3 is a graph showing the results of a measurement repeatability test in which the thickness of a semiconductor substrate was determined seven times in accordance with the present invention.
Figure 4:
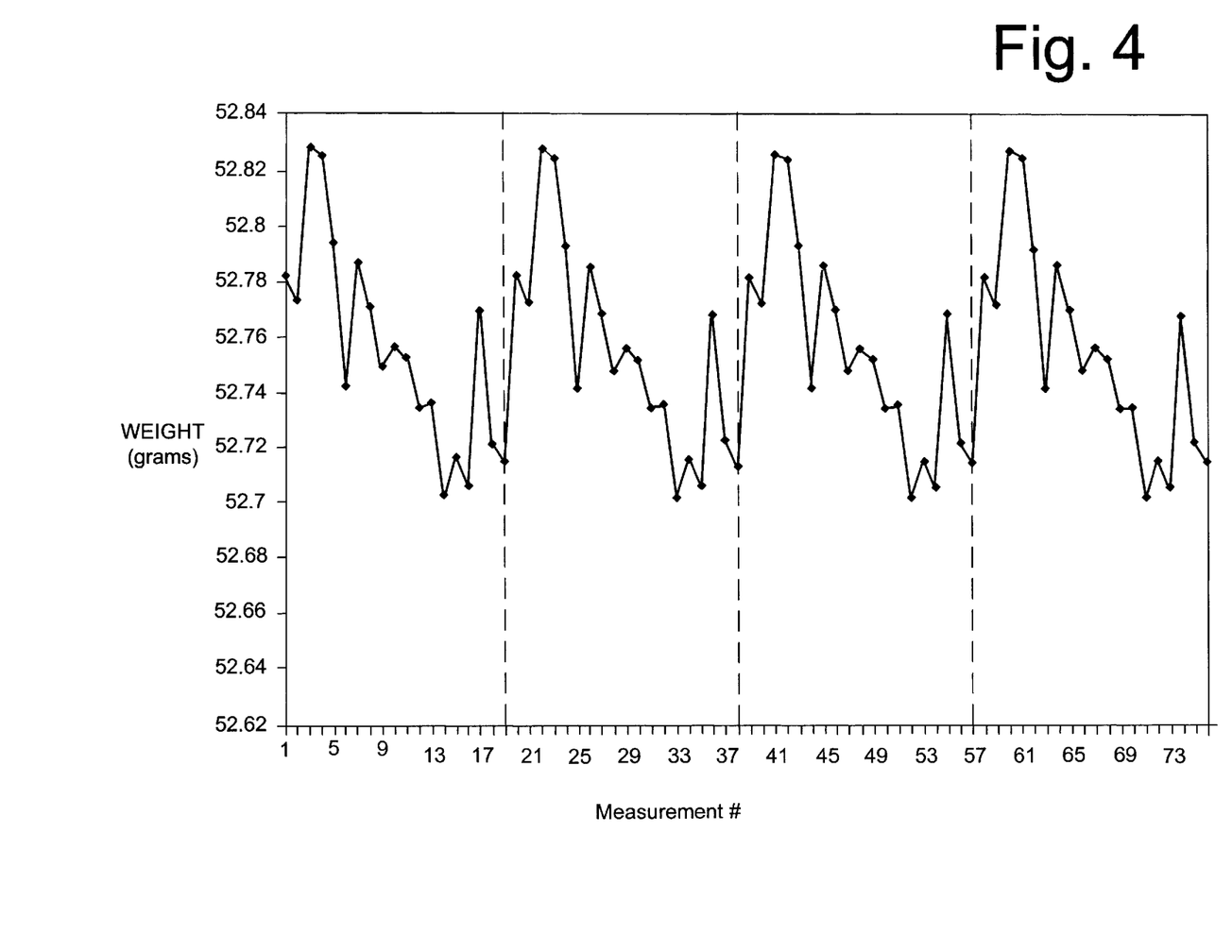
FIG. 4 is a graph showing the results of another repeatability test in which the thicknesses of 19 semiconductor substrates were determined in accordance with the present invention, and then the measurements were repeated three times.

As described above, system 10 meets the semiconductor industry's need for an inexpensive, automated system for characterizing the thicknesses of semiconductor substrates having varying electrical properties and/or surface finishes. Furthermore, as shown in FIGS. 3 and 4, system 10 achieves this goal without sacrificing the accuracy, precision or repeatability of the measurements. FIG. 3 is a graph showing seven thickness measurements made on the same substrate using system 10. As can be seen from the graph, the deviation across the successive measurements is less than 0.01%. FIG. 4 is a graph showing the mass measurements of nineteen substrates, repeated four times as indicated by the dashed lines. Despite the relatively high mass variability among the substrates, the successive measurements for any single substrate were virtually identical.

Figure 5:
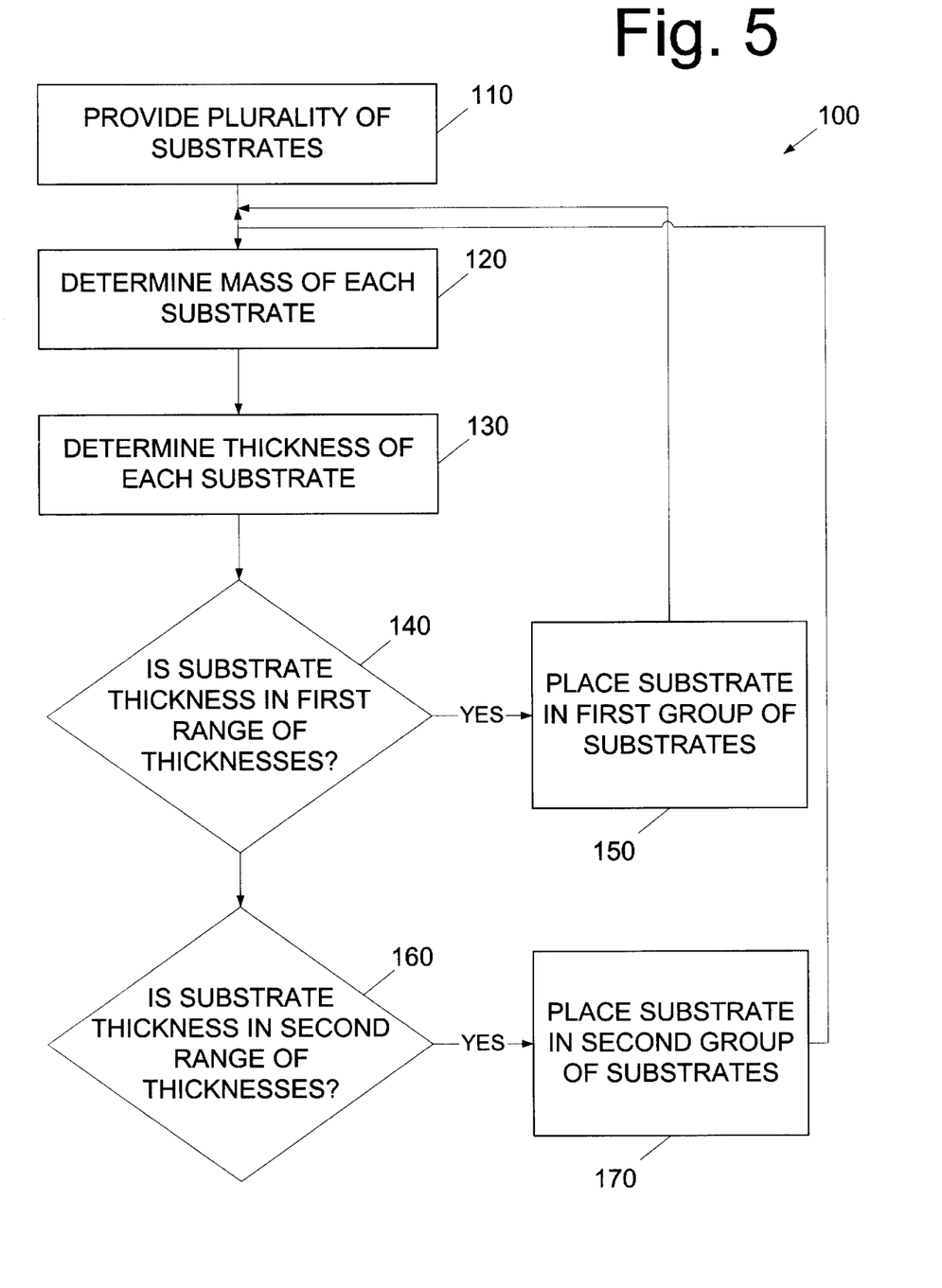
FIG. 5 is a flowchart illustrating a method of sorting semiconductor substrates in accordance with the present invention.

In accordance with the present invention, a method for characterizing and sorting semiconductor substrates based on substrate thickness is indicated generally at 100, in FIG. 5. The method includes, at step 110, providing a plurality of semiconductor substrates to be measured. In contrast to current capacitive and optical measurement systems, system 10 is configured to determine substrate thickness regardless of the electrical properties or surface finishes of the substrates. Therefore, the plurality of substrates may have varying, undetermined electrical properties and/or surface finishes.

Preferably, though not necessarily, the area of the planar surfaces will be known to allow system 10 to determine the absolute thickness of each substrate. As will be understood by those of skill in the art, the accuracy of the absolute thickness measurement will be determined by the accuracy of the value used for the area of the substrate, as well as the accuracy of the mass measurement. Alternatively, if each substrate has a substantially similar, though undetermined, surface area, then system 10 may be used to calculate the relative thicknesses of the substrates. The density of the substrates will be determined from the substrate material.

At step 120, the mass of one of the substrates is determined, for example, by weighing the substrate on a scale. If necessary, the scale is zeroed or calibrated prior to taking the measurement. As discussed above, the accuracy and precision of the scale will determine the accuracy and precision of the thickness measurement. However, where only relative thickness values are needed, then the accuracy of the scale is less important than its repeatability.

In any event, the thickness of the substrate is then determined, at step 130, from the mass, the area and the density according to the following equation:

$$\text{Thickness} = \frac{M}{\rho * A}$$

Where M is the mass of the substrate, p is the density of the substrate, and A is the area of the substrate surface. Typically, the substrate thickness is calculated by a computer in which the area and density of the substrate are stored. Alternatively, the thickness may be calculated by a system operator.

It should understood that the calculated thickness will constitute an average thickness across the substrate. Indeed, the ability to calculate the average thickness of a substrate with a single measurement is a further advantage of the present system and method. In contrast, current capacitive and optical techniques measure the thickness of the substrate in only a relatively small area. Thus, to determine the average thickness of the substrate by those techniques, multiple measurements at several locations must be made.

As those of skill in the art will appreciate, if the plurality of substrates have substantially similar areas and are being sorted based on relative thicknesses, then it is not necessary to actually calculate the thickness of each substrate. Rather, the substrates may sorted based upon their relative masses which, as can be seen from the equation above, are directly proportional to their relative thicknesses. Thus, in an alternative embodiment, step 130 is omitted.

Once the thickness of the substrate is calculated, a decision may be made regarding placement of the substrate. Typically, the system operator will specify multiple ranges of substrate thickness, and then group the substrates within each range together. In the exemplary embodiment shown in FIG. 5, first and second thickness ranges are specified, however the operator may specify any number of ranges as desired. The operator may specify first and second ranges that combine to include all possible substrate thicknesses or only some possible substrate thicknesses. In the latter case, if a thickness measurement is not within any specified range, then the operator can determine what action should be taken, e.g., re-measure the substrate, discard the substrate, calibrate the system, or etc.

In any event, the method continues, at step 140, by determining whether the substrate thickness is within the first range of thicknesses. If the answer is yes, the substrate is placed in a first group of substrates, at step 150. If the thickness of the substrate is not within the first range, then the method continues, at step 160, by determining whether the substrate thickness is within the second range of thicknesses. If the answer is yes, then the substrate is placed in a second group of substrates, at step 170, and the process returns to step 120 until all the substrates have been sorted. If the answer is no, then additional actions may be taken by the operator or programmed into the system controller.

Those of skill in the art will recognize that the substrate sorting method described above may be used in many applications. As one example, a semiconductor substrate manufacturer may use the sorting method to group substrates in lots of uniform substrate thickness prior to sale. As another example, the substrates may be maintained in the sorted groups during subsequent semiconductor processing to allow the subsequent processing to be optimized for varying substrate thickness.

Figure 6:
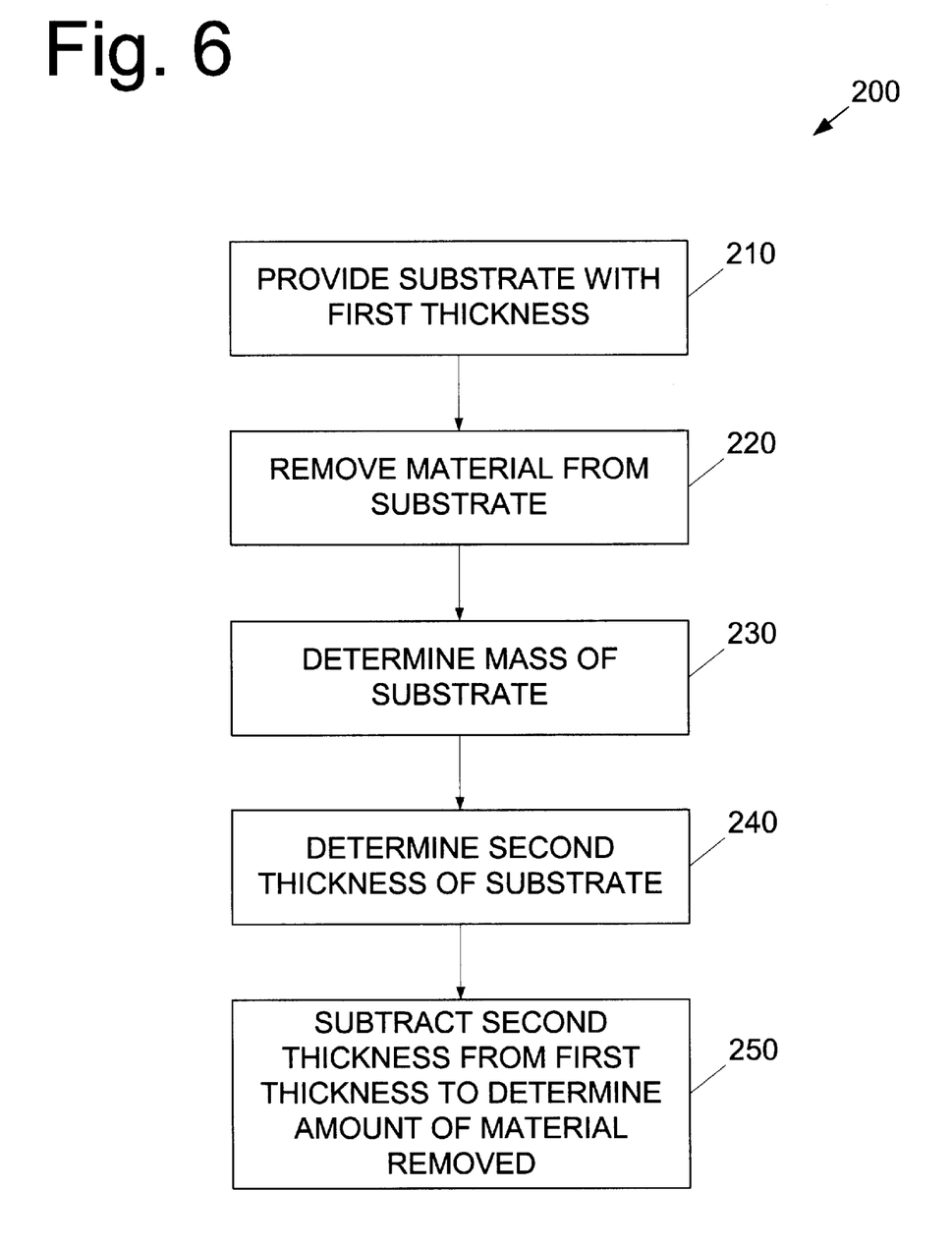
FIG. 6 is a flowchart illustrating a method of characterizing a semiconductor process for removing material from a semiconductor substrate.

In addition to sorting, the present invention also provides a method for characterizing a semiconductor process for removing material from a substrate, as indicated generally at 200, in FIG. 6. For example, the method may be used to determine how much material is removed during grinding, lapping, polishing, etching, and etc. The process includes, at step 210, providing a substrate of known area and density, and having a predetermined first thickness. It will be appreciated that the first thickness may be determined in any suitable way, including as taught by the present invention, capacitively, optically, or etc. The method of determining the first thickness is preferably selected to achieve the accuracy and precision desired.

Subsequently, at step 220, an amount of material is removed from one or both flat surfaces of the substrate using any of the above-described processes, which are well known in the semiconductor manufacturing field. Preferably, the material is removed substantially uniformly across the entire substrate. In any event the substrate will have a second, lesser thickness after the amount of material is removed. The process continues, at step 230, by determining the mass of the substrate as described above. At step 240, the second thickness of the substrate is determined from the mass, the area, and the density. Finally, the amount of material removed is determined by subtracting the second thickness from the first thickness, at step 250. It will be appreciated that since substrate mass is directly proportional to substrate thickness, method 200 may be modified to characterize a semiconductor process based on the mass of material removed rather than the thickness of material removed.

Method 200 may be used in a variety of applications well known to those of skill in the art. As one example, a target value or range of values may be established for the amount of material to be removed. A substrate may then be carried through the semiconductor process and the amount of material that was removed may be measured as described above. The measured value may then be compared to the target value and, if the measured value does not match the target value, the semiconductor process may be modified to remove more or less material as needed.

INDUSTRIAL APPLICABILITY

The present invention is applicable to characterizing semiconductor substrates, and more particularly to characterizing and sorting semiconductor substrates based on substrate thickness.

While the invention has been disclosed in its preferred form, the specific embodiments thereof as disclosed and illustrated herein are not to be considered in a limiting sense as numerous variations are possible. Applicants regard the subject matter of their invention to include all novel and non-obvious combinations and subcombinations of the various elements, features, functions and/or properties disclosed herein. No single feature, function, element or property of the disclosed embodiments is essential to all embodiments. The following claims define certain combinations and subcombinations which are regarded as novel and non-obvious. Other combinations and subcombinations of features, functions, elements and/or properties may be claimed through amendment of the present claims or presentation of new claims in this or a related application. Such claims, whether they are different, broader, narrower or equal in scope to the original claims, are also regarded as included within the subject matter of applicants' invention.

We claim:

1. In a semiconductor process, a method of sorting semiconductor substrates according to substrate thickness, comprising:

providing a plurality of semiconductor substrates, each substrate having a thickness, a predetermined density, and a surface with a predetermined area; and for each of the plural substrates,
determining the mass of the substrate by weighing the substrate,
determining the thickness of the substrate from the mass, the area, and the density,
placing the substrate in a first group of substrates if the thickness of the substrate is within a first range of thicknesses, and
placing the substrate in a second group of substrates if the thickness of the substrate is within a second range of thicknesses.

2. The method of claim 1, wherein the step of determining the thickness includes communicating the mass to a computer programmed to calculate the thickness from the mass, the area, and the density.

3. The method of claim 1, wherein at least one of the placing steps includes robotically transporting the substrate.

4. In a semiconductor process, a method of sorting semiconductor substrates, comprising:

providing a plurality of semiconductor substrates, each substrate having a surface of substantially similar area; and for each of the plural substrates,
determining the mass of the substrate by weighing the substrate,
placing the substrate in one of plural groups of substrates based on the mass of the substrate.

5. For use in a semiconductor process, a system configured to sort semiconductor substrates according to the thickness of the substrates, where the substrates have a predetermined density and a surface of predetermined area, the system comprising:

a scale;

a first substrate holding apparatus;

a second substrate holding apparatus;

a substrate transport apparatus configured to transport substrates between the scale and the first substrate holding device, and between the scale and the second substrate holding device; and a controller operatively connected to the substrate transport apparatus;

where the scale is configured to measure the mass of a substrate and to communicate the mass to the controller;

and where the controller is configured to determine the thickness of the substrate from the mass, the area, and the density, and to operate the substrate transport apparatus to transport the substrate to the first substrate holding apparatus if the thickness of the substrate is within a first range of thicknesses, and to transport the substrate to the second substrate holding apparatus if the thickness of the substrate is within a second range of thicknesses.

6. The system of claim 5, wherein the transport apparatus includes one or more robotic arms.

7. The system of claim 5, wherein at least one of the first substrate holding apparatus or the second substrate holding apparatus includes a portable wafer cassette.

8. The system of claim 5, further comprising an isolation chamber at least partially enclosing the scale.

9. The system of claim 8, wherein the isolation chamber includes an aperture configured to receive the substrate.

* * * * *

UNITED STATES PATENT AND TRADEMARK OFFICE
CERTIFICATE OF CORRECTION

PATENT NO. : 6,286,685 B1  
DATED : September 11, 2001  
INVENTOR(S) : Kononchuk et al.

Page 1 of 1

It is certified that error appears in the above-identified patent and that said Letters Patent is hereby corrected as shown below:

<u>Title page,</u>  
Item [56], References Cited, OTHER PUBLICATIONS, insert the following:  
-- "Silicon Processing for the VLSI Era," Volumne 1: Process Technology, pp. 26-30 and 149-151, © 1986, Lattice Press, Sunset Beach, California --.

Signed and Sealed this

Thirtieth Day of April, 2002

Attest:

JAMES E. ROGAN  
*Director of the United States Patent and Trademark Office*

*Attesting Officer*